March 7, 1972 G. A. DUFFY 3,647,584

CHEMICAL MILLING PROCESS

Filed Jan. 5, 1970 3 Sheets-Sheet 1

INVENTOR.
GREGORY A. DUFFY
BY Huebner & Worrel
ATTORNEYS.

INVENTOR.
GREGORY A. DUFFY
By Huebner & Worrel
ATTORNEYS.

INVENTOR.
GREGORY A. DUFFY
By Huebner & Worrel
ATTORNEYS.

United States Patent Office 3,647,584

Patented Mar. 7, 1972

3,647,584

CHEMICAL MILLING PROCESS

Gregory A. Duffy, 15001 Altata Drive, Pacific Palisades, Calif. 90272

Filed Jan. 5, 1970, Ser. No. 624

Int. Cl. H05k *1/00;* C23f *1/02*

U.S. Cl. 156—11 17 Claims

ABSTRACT OF THE DISCLOSURE

Improved chemical milling process and resulting product utilizing photographically exposed and developed resist designs on a metal plate with unexposed portions of the resist emulsion dissolved away, characterized by a baking step or steps harder than conventional, a series of controlled etching treatment on one side, and a series of differently controlled harsher etching treatment on the other side, resulting in a design of suspended metal areas having substantially flat plane or slightly concave etched edges as distinguished from shoulders or ridges. A particular application is for producing electrical circuitry utilizing a metallic plate containing identical circuit designs on both sides formed of the photographic etch resist, and upon removal of the unwanted metal by the differential etching steps on opposite sides of the plate, obtaining an integrated circuit structure with conductors responding to the etch resistant pattern and in cross section being substantially rectangular with parallel top and bottom and parallel sides, or with the sides very slightly concaved, thus providing adequate surfaces on the sides for attachment of wires by welding.

BACKGROUND OF THE INVENTION

Research and development work has been in progress for some time, and at great expense, to produce a satisfactory preformed metallic circuit in an integrated form, which may be utilized in connection with electrical components to build a sandwich type package as a module in an electrical or electronic system, especially for miniature or sub-miniature systems.

Preliminary steps have been conventional, and correspond in general to the preliminary steps in producing a printed circuit board. A drawing of the circuit is prepared and is photographically reproduced as a negative in the size of the contemplated circuit. Instead of using the photographic negative as an aid toward depositing metal on an insulating board, the negatives have been used to print the circuit by photographic exposure on a sensitive emulsion coating a metallic plate, which when developed displays the circuit in etch resistant lines. The plate has then been subjected to an etching solution which removes the metal between the lines. The etching has been done simultaneously on both sides, in the same bath, meeting at the middle for a breakthrough.

The result has been completely unsatisfactory and practically unusable for certain purposes. One reason is that on the type of metal desired, and of the preferred thickness for much circuitry, approximately .020 inch (or more), the side walls of the conductors are not flat and parallel. They come out with shoulders, being roughly in the shape of a baseball diamond, sometimes with undercuts below the edge of the resist. This provides only a line contact for the fine wire from an electrical component to rest against. Consequently the welding operation of the wire to the conductor is not only a very difficult one but even when completed is unreliable.

Numerous efforts have been reported to me to chemically mill a satisfactory circuit in a plate of desired thickness, all unsuccessful. In fact, one authority reports that it cannot be done within acceptable tolerances.

In their experiments, others who have tried to etch conventionally, both sides at the same time in the same bath, have also sustained an inordinate loss of metal in the conductors. As an example, when working on a circuit pattern with the resistant lines .030 inch wide, the conductors after etching away the non-wanted metal have been cut down to about .010 inch width, the difference being loss.

Other attempts have been made by controlled spray etching on each side of photo sensitized and developed plates, using the same etchant solution on both sides. An approach to acceptable results has been thus obtained on thin metal. It does not produce the plane parallel walls which are desired when attempted on thicker metal such as .020 inch or more, which is considered essential for many electrical packages.

Consideration has been given to the possible use of dies to cut the plates. Such are sometimes prohibitively expensive (many circuit patterns are intricate), time delay is involved, maintenance is a costly problem, and these are all multiplied when duplicate dies are required for multiple production. Stampings are often unsatisfactory because of burrs and deformed edges, the metal worked on is usually very hard (nickel or equivalent), and cannot be depended on to shear properly, tolerances are difficult if not impossible to hold, and stresses may be introduced.

The same considerations apply to products other than circuitry. In some cases irregularities and shoulders are not particularly objectionable, but there are many items which it would be desirable to produce by chemical milling and which require the flat plane type of edges described. Prior etching processes have not succeeded in accomplishing the wanted result.

SUMMARY OF THE INVENTION

I have discovered that chemical milling can be employed to produce a desired configuration from a metallic plate of .020 inch or greater thickness, within acceptable tolerances, inconsequential loss of line width, and with side walls which are substantially flat (or slightly concave in vertical section), providing in circuitry, maximum surface for engagement with wires being welded thereto.

In achieving this I have made a marked departure from previous methods known to me. The etching is first performed on one side only to a predetermined depth, then on the other side to a breakthrough. The timing for each side differs, the etching on the first side proceeds somewhat more than half way through the plate, and the bath used on the second side differs from that of the first.

A superior result can be obtained additionally by baking the resist differently than in previous practice, a pre-bake of the coated plate prior to exposure for extra drying and semi-crystallizing the resist, and a post-bake after exposure and developing to harden the image and create a flaky effect. Both the pre-bake anad post-bake are harsher than conventionally practiced. The purpose is to put the resist in a condition so it will break down with the etch and avoid any undercut or shoulder.

Particulars with reference to the foregoing process features will be described in detail.

Although the process is applicable to the production of various items, the description will use for illustration and convenience, but not by way of limitation, the production of electrical circuitry.

PREFERRED EMBODIMENT OF THE INVENTION

Figure 2:
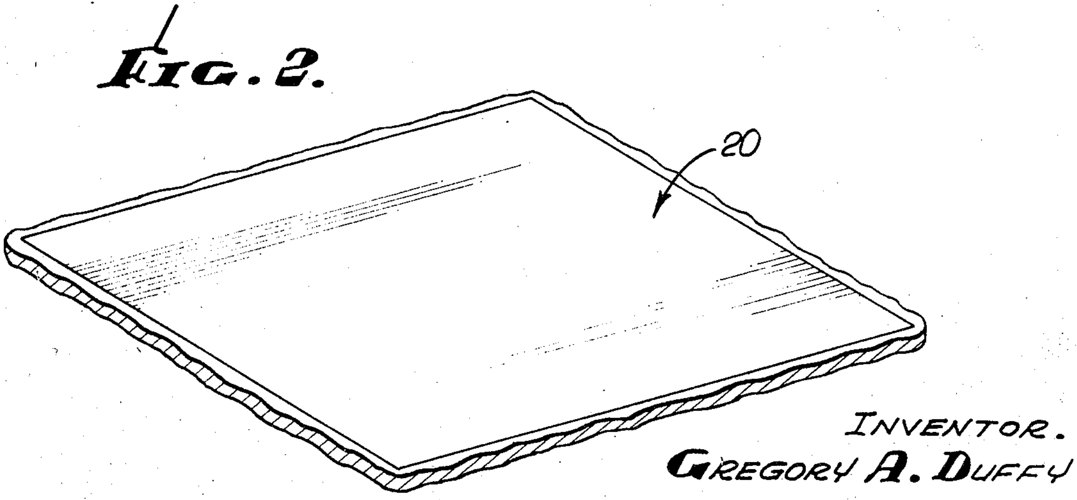
FIG. 2 is a fragmentary perspective of a sensitized plate.

In practicing the invention certain usual preliminaries are followed. A large drawing is made of the circuitry and ties or other structure desired. This is photographed to final size on a master negative, and from the latter two identical negatives are prepared. A metal plate 20 (see FIG. 2) coated on each side with a sensitized etch resistant, sometimes termed a photoresist, or simply a resist, is sandwiched between the two identical negatives, and printed by exposure to light. Emulsions of the type required, such as Eastman Kodak's photoresist, are well known and available, and such procedure is also known in the art. A resist which meets the requirements of my process and responds to the treatment as delineated herein is identified as Eastman Kodak "KMER," which is a standard Eastman Kodak Company product.

The plate is developed in a suitable developer, and dried according to established practice. Unexposed portions do not harden during developing but are washed away.

Figure 3:
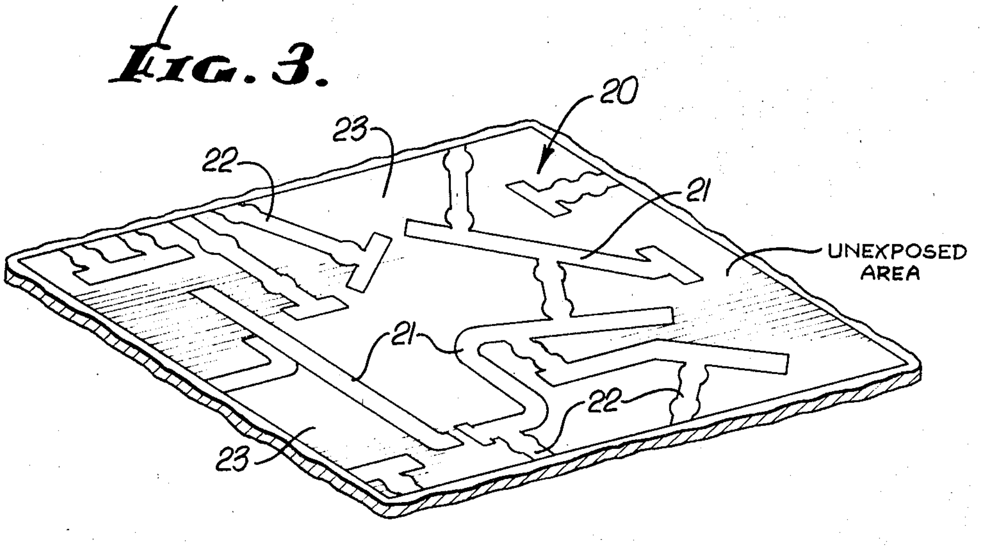
FIG. 3 is the same plate as FIG. 2 after exposure and development.

This results in the image delineated by areas 21 which appear on both sides of the plate and which exemplify the circuitry, see FIG. 3. Any necessary or desired support ties are included in the image, as shown at 22. These areas will resist the etching agent. The metal 23 between the image areas, having the resist washed way, will be chemically dissolved away by the etchant.

In addition to the steps outlined, it has been the general practice to pre-bake the plate before the printing step and post-bake it after development, under relatively mild conditions (time and temperature) which will assure that the resist on the plate remains in a rubbery state.

I have discovered that a marked advantage can be realized by a relatively harsh baking, which may be termed over baking, for both the pre-bake and post-bake. What I want to achieve is a semi-crystalline or semi-charred condition. This requires a much higher temperature than used heretofore.

The pre-bake may be done satisfactorily for my purpose, in an infra red oven at a temperature of about 850° to 1000° F. for approximately 1½ to 2 minutes. This may be varied according to the particular emulsion employed to achieve the result indicated, but so that the baking is stopped before the plate fogs.

After the exposure and developing steps, the plate is subjeced to a post-baking procedure to harden the image to a far greater extent and to create a flaky effect, so that the resist will tend to break down as etching proceeds. The purpose is to avoid an undercut and formation of a shoulder. The post-baking may be done in the same or similar oven as the pre-baking, but should be at a higher temperature and for a longer period. As an example, the temperature may range from 850° to 1000° F. for approximately 3 to 4 minutes.

The next steps involve the etching. For the purpose of illustration, and not of limitation, it will be assumed that the plate is high purity hard nickel of .020 inch thickness, and that the width of the printed circuitry line area is about .022 inch.

The plate may be taped on a ¼" or ½" thick plastic board, using ½" wide tape around the perimeter. This taping defines a frame and with the board also protects the opposite side of the plate from the etchant.

In the present illustration, I use for the first bath a 30 Baumé iron chloride with a 42 Baumé nitric acid mixed in proportions of about 14 parts of chloride to 1 of acid, by volume. It is advantageous but not absolutely necessary, to add about ⅛ of 1 part of muriatic acid. Preferably this bath is maintained at a temperature within a range of 84° to 100° F. This bath is contained in any suitable etching machine.

The machine used in conjunction with the steps next described is one in which the plate is held approximately vertical, and the etchant is splashed up by paddles, striking the plate and falling away.

The mounted plate is placed in such a machine and the etching proceeds in a first stage for approximately five minutes. The machine is stopped and the position of the plate is reversed in order to obtain an application of the etchant bath in the opposite direction.

Etching then proceeds in a second stage for approximately six minutes. The machine is then stopped and the plate returned to its original position.

Thereupon, a third stage of etching proceeds for about six and one-half minutes.

Figure 4:
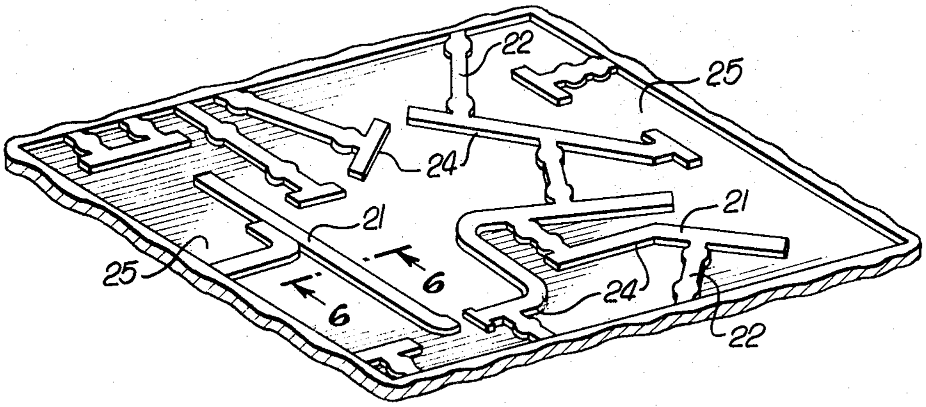
FIG. 4 is the same plate after etching on one side.
Figure 6:
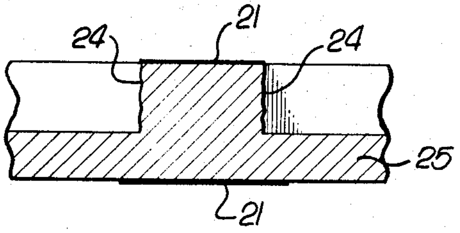
FIG. 6 is a magnified fragmentary section taken on the line 6—6 of FIG. 4.

The three stages occupy a total etching time of approximately seventeen and one-half minutes, the change of position results in cleaning up the edges, and the total depth etched should then be about .012 inch or slightly more than half the thickness of the plate. This is illustrated in FIGS. 4 and 6, and the etched edges are indicated at 24. The remaining plate material to be dissolved is indicated at 25.

The plate is then turned over on the board and re-taped. The re-taping protects the side which has been etched, and masks off the frame area.

A series of three etching stages is then practiced, with a reversal in position of the plate as previously described. However, there is a difference in times and solution which I have found to be important.

The bath used for this second series uses the same chemicals but in a proportion of about 14 parts of iron chloride to 1¼ parts of nitric acid, by volume. Addition of muriatic acid is again found desirable, but in this solution only about 1⁄16 of 1 part is recommended. Also a longer etch is employed, preferably about six minutes in the first stage, seven minutes in the second stage, and seven and one-half minutes in the third stage, a total of about twenty and one-half minutes.

Breakthrough occurs before the final stage is completed, and the remainder is used for a finishing action.

Figure 5:
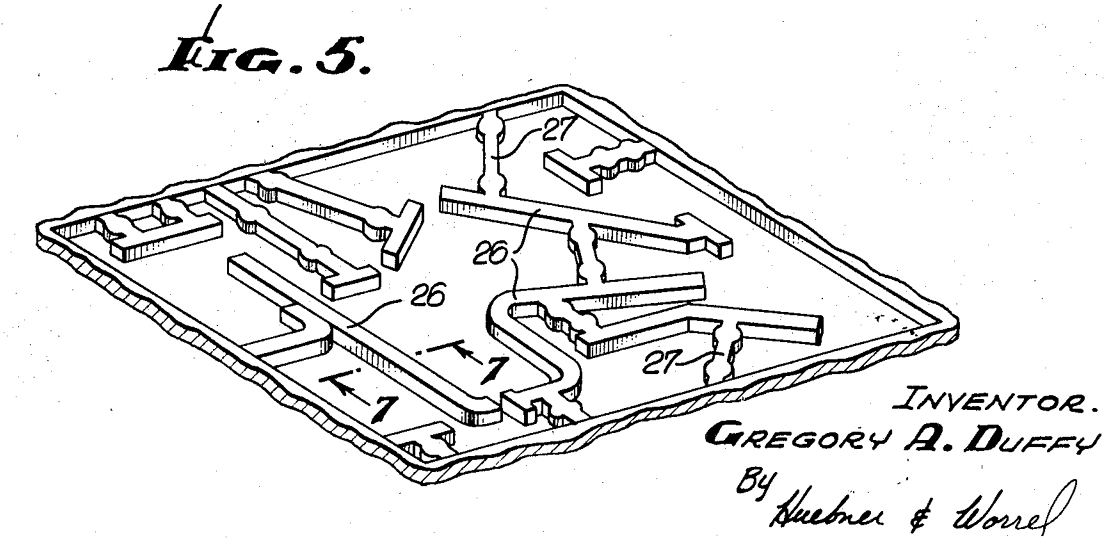
FIG. 5 is the same plate after etching and breakthrough from the other side, and contains conductors supported by ties to a frame.
Figure 9:
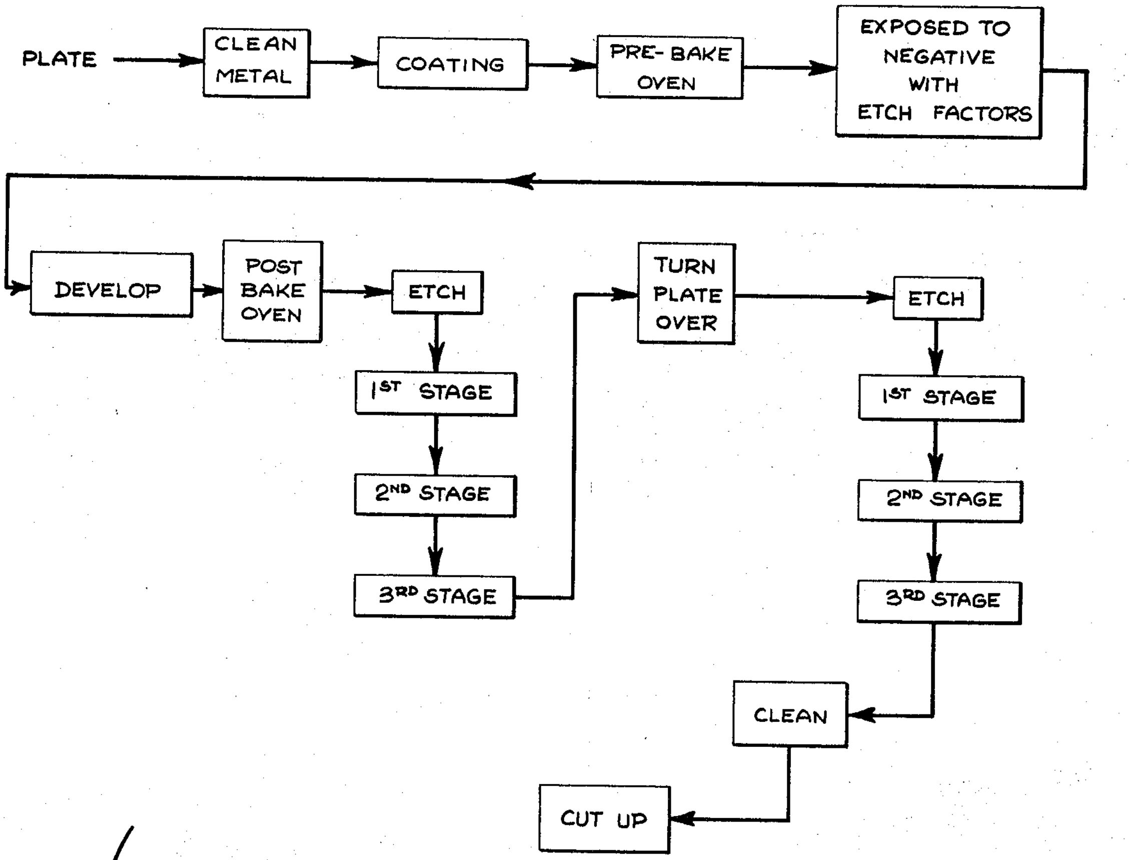
FIG. 9 is a flow sheet delineating the steps of the process.
Figure 7:
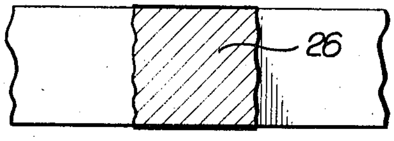
FIG. 7 is a magnified fragmentary setcion taken on the line 7—7 of FIG. 5.

The product at this point is a plurality of conductors 26 and ties 27 as illustrated in FIGS. 5 and 7. The completely etched plate may be cleaned, then utilized as desired.

Using the materials and steps as described, the width of the conductors may have been reduced from approximately .022 inch to within a tolerance of about .012 to .015 inch, but with edges which are generally flat. The over baking steps described contribute to this result, as the resist breaks down at the edges as the metal dissolves. This reduction in width represents far less loss than sustained by previous attempts, and with an edge surface which was never to my knowledge achieved by prior etching processes. It not only is generaly flat, or possibly slightly concave, and is without the objectionable shoulder, but the grain of the metal will be exposed. This slight roughness can afford a superior welding surface.

This method may be used on plates which are more than .020 inch in thickness.

Figure 1:
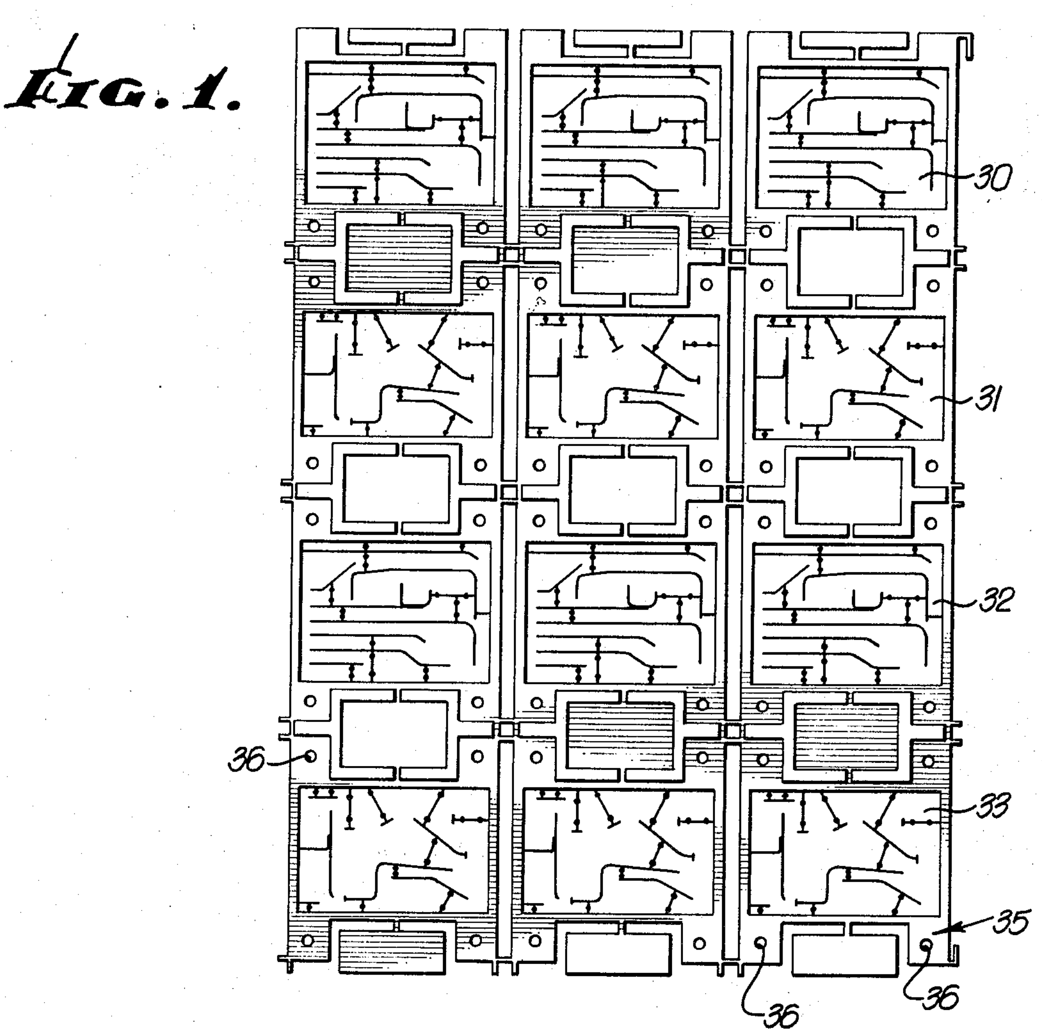
FIG. 1 is a top plan view of a completely etched plate containing a plurality of electrical circuitry units which can be separated for individual use.

The finished etched plate, as shown in FIG. 1, may be cut up and the sections used as desired. Sometimes the separated sections 30, 31, 32, and 33 will be cut apart on median lines in both directions and each rectangular section assembled by stacking with other components.

Frame 35 may embody holes 36, the later being used for registration with other components.

Figure 8:
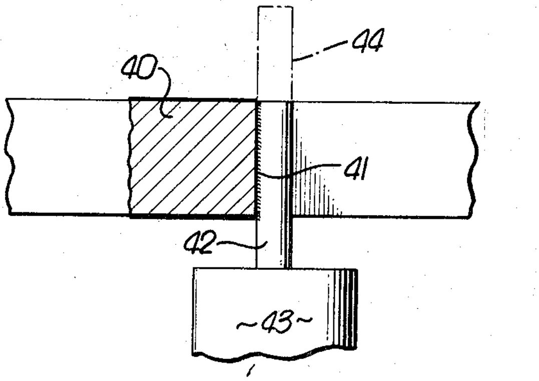
FIG. 8 is a magnified section of the conductor shown in FIG. 7 illustrating the wire lead from an electrical or electronic component welded thereto.

Illustrative of use, FIG. 8 shows a greatly magnified section of conductor 40 to which is welded as at 41 a fine wire 42 leading from an electrical or electronic element 43. The upper end of the wire shown in phantom at 44, usually held by tweezers during welding, will ordinarily be cut off.

After assembly of components, the ties 22 may be snipped off, carrying the frame with them for discarding.

For metals other than the nickel referred to, the etching solution may be changed, likewise the time of application, in accordance with known relative characteristics. It is important, however, to preserve the differential etching stages, assure that the first series dissolves at least half way through (preferably slightly more) the thickness of the metal, and that the second series provides a harsher and longer application.

Although I have described the use of a photographic process for transferring the resist image to the plate, a suitable resist could be sprayed on the plate through a stencil, or silk screened on, or printed or otherwise applied. It is essential that the resist be amenable to over baking for the purposes previously described.

Furthermore, if an etching apparatus be available which would apply the etchant to the plate evenly as by rotation, or from opposite directions, I could avoid having to stop the machine and reverse the position of the plate. The total time, temperature, and solutions for the respective sides, in the order mentioned, would be applicable.

Although I have herein shown and described my invention in what I have conceived to be the most practical and preferred embodiment, it is recognized that departures may be made therefrom within the scope of my invention.

What I claim is:

1. In a process of chemically milling structural designs from a metal plate which has the designs delineated on both sides of the plate with an etch resistant coating, the improvement which results in producing substantially plane flat or slightly concave surfaced edges between opposite surfaces of the structural designs, comprising: heat treating the coating prior to applying any etchant to an extent sufficient to produce a flaky characteristic in the coating so that it breaks away as the etchant attacks the metal in the region along the edge of the coating, first etching by subjecting the plate on one side only to an etching solution of predetermined acidity for a predetermined time to dissolve away unprotected metal to a depth of at least half the thickness of the plate, and secondly etching by subjecting the plate on the other side only to an etching solution of greater acidity and for a longer time to at least a breakthrough of the unprotected metal.

2. In a process as defined in claim 1, in which the etch resistant coating is a photographic emulsion and the designs are obtained by exposure to light, the inclusion in the heat treating procedure of prebaking the plate before it is photographically exposed for a time and at a temperature which will contribute to making the coating flaky as distinguished from rubbery.

3. In a process and improvement as defined in claim 1 in which the etch resistant coating is a photographically exposed and developed emulsion, the inclusion in the heat treating procedure of post-baking the plate after development and prior to etching, for a time and at a temperature which will make the remaining coating semi-crystalline or semi-charred, whereby it will flake off at the edges as the metal is dissolved.

4. In a process and improvement as defined in claim 1, in which the first etching is performed in a plurality of stages, and the second etching is also performed in a plurality of stages.

5. In a process and improvement as defined in claim 1, in which the first etching is performed in three stages, each succeeding stage being for a longer period than the preceding one, and the second etching is also performed in three stages, each succeeding stage being for a longer period than the preceding one.

6. In a process and improvement as defined in claim 1, the metal plate being high purity hard nickel, and the etching solutions being mixtures of iron chloride and nitric acid.

7. In a process and improvement as defined in claim 6, the metal plate being of at least approximately .020" thickness, and the first etching solution used comprising about 14 parts of 30 Baumé iron chloride mixed with about 1 part of 42 Baumé nitric acid, by volume, and the second etching solution used comprising about 14 parts of similar iron chloride mixed with about 1¼ parts of similar nitric acid.

8. In a process of chemically milling structural designs from a plate of high purity hard nickel of at least approximately .020" thickness and with the edges of the milled designs having generally flat plane or slightly concave surfaced edges, the steps comprising taking a plate as described having applied to both sides thereof a photoresist coating, exposing the plate on both sides through identical negatives representing designs to be milled, at least one of the designs appearing as a strip approximately .022" wide, developing the plate, baking the plate at a temperature and for a time sufficient to make the photoresist remaining on the plate semi-charred, subjecting the plate on one side only to an etchant comprising iron chloride with nitric acid mixed in proportions of about 14 parts of chloride to 1 part of acid, for a time sufficient to remove unprotected metal at least half through the plate, then applying to the other side only of the plate an etchant comprising iron chloride with nitric acid mixed in proportions of about 14 parts of iron chloride to 1¼ parts of nitric acid, for a time sufficient to break through and finish the etching, so that the strip which was originally approximately .022" wide becomes a metal bar having a width within a tolerance of about .012" to .015" and retaining an original thickness of about .020".

9. In a process of producing electrical circuitry by chemically milling conductors from a plate of high purity hard nickel of at least approximately .020" thickness and with the edges of the conductors having generally flat plane or slightly concave surfaced edges, the steps comprising: taking a plate as described having applied to both sides thereof a photoresist coating, baking the coated plate at a temperature within the range of about 850° to 1000° F. for approximately one and one-half to two minutes, exposing the plate on both sides through identical negatives representing in transparency the conductors to be formed, developing the plate, baking the plate at a temperature of approximately 850° to 1000° F. for approximately three to four minutes, applying to one side only of the plate an etchant comprising 30 Baumé iron chloride with a 42 Baumé nitric acid mixed in proportions of about 14 parts of chloride to one of acid, by volume, maintained at a temperature within the range of approximately 84° to 100° F., for approximately seventeen and one-half minutes, then applying to the other side only of the plate an etchant comprising 30 Baumé iron chlorine with a 32 Baumé nitric acid mixed in proportions of about 14 parts of iron chloride to 1¼ parts of nitric acid, by volume, maintained at a temperature within the range of approximately 84° to 100° F., for approximately twenty and one-half minutes.

10. In a process of the character defined in claim 9, using an etchant composed as described but with the addition of approximately ⅛ of 1 part muriatic acid to the first etchant and approximately $\frac{1}{16}$ part muriatic acid to the second etchant.

11. In a process of the character defined in claim 9, the etchant being applied by splashing it against the plate in one direction a portion of the times recited, and in an opposite direction the remainder of the times recited.

12. In a process of the character defined in claim 9 the etchant being applied by splashing it against the one side of the plate in one direction for approximately five minutes, then in an opposite direction for approximately six minutes, finally in the original direction for approximately six and one-half minutes and against the other side of the plate in one direction for approximately six minutes, then in an opposite direction for approximately seven minutes, and finally in the original direction for approximately seven and one-half minutes.

13. In a process of chemically milling a structural member having a generally rectangular cross section from a metal plate which has the plan area of the member delineated on opposite sides of the plate with an etch resistant coating, the steps comprising: heat treating the coating prior to applying any etchant to an extent sufficient to produce a flaky characteristic in the coating so that it breaks away as the etchant attacks the metal in the region along the edge of the coating, applying an etchant of given characteristics to one side of the plate to remove unprotected metal about half through the plate, and applying an etchant of harsher characteristics to the other side of the plate to accomplish a breakthrough.

14. The process defined in claim 13 wherein the etch resistant coating is a photographic emulsion which is developed by exposure to light, and wherein the coated plate is heat treated by being pre-baked before it is photographically exposed at a temperature within the range of about 850° to 1000° F. for approximately one and one-half to two minutes and by being post-baked after development and prior to etching at a temperature within the range of about 850° to 1000° F. for approximately three to four minutes.

15. In a process of chemically milling a structural member having a generally rectangular cross section from a metal plate which has the plan area of the member delineated on opposite sides of the plate with an etch resistant coating, the steps comprising: heat treating the coating to produce a flaky coating which breaks away as metal in the region along the edge of the coating is etched away and applying etchants to each side of the plate to etch away the uncoated metal.

16. The process defined in claim 15, wherein the plate is made of high purity hard nickel of at least .020 inch thickness.

17. The process defined in claim 15 wherein the coating on the plate is formed by a photographic emulsion and is heat treated by pre-baking the plate before the coating is developed at a temperature within the range of about 850° to 1000° F. for approximately one and one-half to two minutes and is post-baked after development at a temperature within the range of about 850° to 1000° F. for approximately three to four minutes.

References Cited

UNITED STATES PATENTS 2,536,383 1/1951 Mears et al. ........ 156—11 X

OTHER REFERENCES

Applications Data for Kodak Photosensitive Resists, cpw. 1967 (1966), by Eastman Kodak Co. pp. 3 and 24.

JABOB H. STEINBERG Primary Examiner

U.S. Cl. X.R.

156—13; 96—36.2